United States Patent
Hirokane

(10) Patent No.: US 7,723,856 B2
(45) Date of Patent: May 25, 2010

(54) EPOXY RESIN COMPOSITION FOR THE ENCAPSULATION OF SEMICONDUCTORS AND SEMICONDUCTOR DEVICES

(75) Inventor: Daisuke Hirokane, Utsunomiya (JP)

(73) Assignee: Sumitomo Bakelite Co., Ltd., Tokyo (JP)

( * ) Notice: Subject to any disclaimer, the term of this patent is extended or adjusted under 35 U.S.C. 154(b) by 614 days.

(21) Appl. No.: 10/594,322

(22) PCT Filed: Mar. 10, 2005

(86) PCT No.: PCT/JP2005/004705

§ 371 (c)(1),
(2), (4) Date: Jan. 17, 2007

(87) PCT Pub. No.: WO2005/097892

PCT Pub. Date: Oct. 20, 2005

(65) Prior Publication Data

US 2007/0216040 A1    Sep. 20, 2007

(30) Foreign Application Priority Data

Mar. 30, 2004   (JP)   ............................. 2004-100256

(51) Int. Cl.
*H01L 23/29* (2006.01)
*C08L 63/00* (2006.01)
*C08K 3/10* (2006.01)

(52) U.S. Cl. ........................ 257/789; 257/787; 257/788; 257/793; 257/795; 523/440; 523/457

(58) Field of Classification Search ........................ None
See application file for complete search history.

(56) References Cited

U.S. PATENT DOCUMENTS 5,919,844 A * 7/1999 Shimizu et al. ............. 523/457
6,190,787 B1 * 2/2001 Maeda et al. ............... 428/620

FOREIGN PATENT DOCUMENTS

| JP | 2002 53734 | | 2/2002 |
| JP | 2002 80695 | | 3/2002 |
| JP | 2002-161193 | * | 6/2002 |
| JP | 2002 212393 | | 7/2002 |
| JP | 2002 220511 | | 8/2002 |

OTHER PUBLICATIONS

Machine translation of JP 2002-161193, provided by the JPO website (2002).*
Machine translation of JP 2002-080695, provided by the JPO website (2002).*
Machine translation of JP 2002-212393, provided by the JPO website (2002).*

* cited by examiner

*Primary Examiner*—Michael J Feely
(74) *Attorney, Agent, or Firm*—Oblon, Spivak, McClelland, Maier & Neustadt, L.L.P.

(57) ABSTRACT

An epoxy resin composition for encapsulating semiconductors containing an epoxy resin, a phenol resin, an inorganic filler, a curing accelerator, a glycerol tri-fatty acid ester produced by dehydration condensation reaction of glycerol and a saturated fatty acid with a carbon atom content of 24-36, and a hydrotalcite compound as essential components is provided. The resin composition exhibits excellent mold releasability and produces only a slight amount of stains on the surfaces of the mold and semiconductor packages. A semiconductor device exhibiting excellent solder resistance is also provided.

8 Claims, No Drawings

EPOXY RESIN COMPOSITION FOR THE ENCAPSULATION OF SEMICONDUCTORS AND SEMICONDUCTOR DEVICES

TECHNICAL FIELD

The present invention relates to an epoxy resin composition for encapsulating semiconductors and to a semiconductor device.

BACKGROUND ART

In recent years, encapsulating semiconductor devices with an epoxy resin composition is mainly conducted due to an excellent balance among productivity, cost, reliability, and the like. Along with miniaturization of semiconductor devices, epoxy resin compositions for encapsulating the semiconductor devices are required to have lower viscosity, higher strength, and lower water absorption than ever before. For this reason, a recent tendency of epoxy resin compositions is to use a resin with lower viscosity and a larger amount of inorganic fillers. From the viewpoint of reducing environmental stress, a lead-free solder with a higher melting point is widely used for mounting semiconductor devices. A problem of this type of solder is the requirement for a mounting temperature that is about 20° C. higher than that required for conventional solders, which results in unduly impaired reliability of semiconductor devices after mounting. For these reasons, promoting reliability of semiconductor devices by improving epoxy resin compositions is urgently desired. Since improvement of adhesiveness of a resin with materials forming semiconductor devices, along with improvement of the strength and reduction of water absorptivity of cured epoxy resin compositions, is an important factor for improving reliability of semiconductor devices, a technique of increasing adhesion and high filler loading has been employed.

On the other hand, with regard to the manufacturing system for semiconductor devices, since the number of packages fabricated in one shot has increased and the shot time for fabricating semiconductor devices has been reduced to decrease the production cost, an epoxy resin composition that can be quickly cured and easily released from a mold is desired.

Although a number of researches have been undertaken to satisfy these requirements and their results have been reported in a number of publications, the methods developed heretofore solve only one or two problems among the many outstanding problems. A process that can satisfy all of these requirements and can be applicable on an across-the-board basis has not yet been developed.

Japanese Patent Application Laid-open No. 2002-220511 discloses a method for increasing adhesiveness of an epoxy resin composition, which comprises an epoxy resin, a phenol curing agent, a curing accelerator, and an inorganic filler, with construction materials of semiconductor devices by adding an adhesion promoter such as a coupling agent. Since the addition of an adhesion promoter impairs releasability, the productivity of the resulting resin composition is not satisfactory. In the case of a technique of adding a curing accelerator with an objective of reducing the molding cycle, the resin composition has impaired flowability, making it difficult to increase the amount of inorganic filler. The resulting resin composition has only unsatisfactory reliability. If a large amount of releasing agent is added to improve mold releasability, not only adhesiveness of the lead frame for mounting the semiconductor device with the cured product of the epoxy resin composition is impaired, but also a considerable amount of the releasing agent oozes from the mold surface and stains the surfaces of the mold and semiconductor packages.

Japanese Patent Application Laid-open No. 2002-80695 discloses an epoxy resin composition for encapsulating semiconductors, in which glycerol tri-fatty acid ester produced by a dehydration condensation reaction of glycerol and a saturated fatty acid with a carbon atom content of 24-36 is added to an epoxy resin composition comprising an epoxy resin, a phenol curing agent, a curing accelerator, and an inorganic filler to promote mold releasability. The epoxy resin composition for encapsulating semiconductors not only exhibits excellent mold releasability, but also can reduce stains on the surfaces of the mold and semiconductor packages. However, the effect of reducing stains on the surfaces of the mold and semiconductor packages of the epoxy resin composition is still insufficient.

In view of this situation, development of a technique ensuring high productivity and high reliability of semiconductor devices is strongly desired.

DISCLOSURE OF THE INVENTION

Accordingly, an object of the present invention is to provide an epoxy resin composition for encapsulating semiconductors exhibiting excellent mold releasability and producing only a slight amount of stains on the surfaces of the mold and semiconductor packages and a semiconductor device exhibiting excellent solder resistance.

In view of the above-described situation, the inventors of present invention have conducted extensive studies. As a result, the inventors have found that an epoxy resin composition for encapsulating semiconductors exhibiting excellent mold releasability, producing only a slight amount of stains on the surfaces of the mold and semiconductor packages can be obtained by blending an epoxy resin, a phenol resin, an inorganic filler, a curing accelerator, a glycerol tri-fatty acid ester produced by a dehydration condensation reaction of glycerol and a saturated fatty acid with a carbon atom content of 24-36, and a hydrotalcite compound. Furthermore, a semiconductor device exhibiting excellent solder resistance can also be obtained. This finding has led to the completion of the present invention.

Specifically, the present invention provides an epoxy resin composition for encapsulating semiconductors comprising (A) an epoxy resin, (B) a phenol resin, (C) an inorganic filler, (D) a curing accelerator, (E) a glycerol tri-fatty acid ester produced by a dehydration condensation reaction of glycerol and a saturated fatty acid with a carbon atom content of 24-36, and (F) a hydrotalcite compound as essential components.

The present invention also provides a semiconductor device comprising semiconductor elements sealed using the epoxy resin composition.

According to the present invention, an epoxy resin composition for encapsulating semiconductors exhibiting excellent mold releasability during molding and producing only a slight amount of stains on the surfaces of the mold and semiconductor packages, as well as a semiconductor device exhibiting excellent solder resistance, can be obtained.

BEST MODE FOR CARRYING OUT THE INVENTION

Embodiments of the present invention will now be described. It should be understood that the present invention is not restricted by these embodiments.

In the present invention, an epoxy resin composition for encapsulating semiconductors exhibiting excellent mold releasability and producing only a slight amount of stains on the surfaces of the mold and semiconductor packages can be obtained by adding a glycerol tri-fatty acid ester produced by a dehydration condensation reaction of glycerol and a saturated fatty acid with a carbon atom content of 24-36 and a hydrotalcite compound to an epoxy resin composition containing an epoxy resin, a phenol resin, an inorganic filler, and a curing accelerator as main components. Furthermore, a semiconductor device exhibiting excellent solder resistance can also be obtained.

Each component of the present invention will be described below in detail.

The epoxy resin used in the present invention includes monomers, oligomers, and polymers having two or more epoxy groups in the molecule. There are no specific limitations to the molecular weight and molecular structure of the epoxy resin. Examples of such an epoxy resin include a bisphenol A epoxy resin, o-cresolnovolac epoxy resin, naphtholnovolac epoxy resin, phenolaralkyl epoxy resin, dicyclopentadiene-modified phenol epoxy resin, biphenyl epoxy resin, stilbene epoxy resin, and the like. These epoxy resins may be used either individually or in combination of two or more. When wetproof reliability as an epoxy resin composition for encapsulating semiconductors is taken into consideration, the content of ionic impurities such as $Na^+$ and $Cl^-$ should be as small as possible. From the viewpoint of curability, the epoxy equivalent is preferably 100-500 g/eq.

The phenol resin used in the present invention includes monomers, oligomers, and polymers having two or more phenolic hydroxyl groups in the molecule. There are no specific limitations to the molecular weight and molecular structure of the phenol resin. Examples include a phenolnovolac resin, phenolaralkyl resin, terpene-modified phenol resin, dicyclopentadiene-modified phenol resin, and the like. These phenol resins may be used either individually or in combination of two or more. From the viewpoint of curability, the hydroxyl equivalent is preferably 90-250 g/eq.

As the inorganic filler used in the present invention, molten silica, spherical silica, crystal silica, alumina, silicon nitride, aluminum nitride, and the like which are commonly used in a encapsulating material can be given. Taking filling performance in a mold into consideration, the inorganic fillers preferably have a maximum particle size of 150 μm or less. The amount of the inorganic filler to be added is preferably in a range of 80-94 wt %. If the amount is less than the lower limit of this range, cured products of the epoxy resin composition have an increased water adsorptivity and, therefore, may have lowered strength, which may result in impaired soldering resistance. If the upper limit is exceeded, the flowability may become insufficient, which may impair formability of the epoxy resin composition.

As the curing accelerator, any curing accelerators commonly used in encapsulating materials that can accelerate the reaction of an epoxy group with a phenolic hydroxyl group can be used in the present invention. Examples include diazabicycloalkene and its derivatives such as 1,8-diazabicyclo(5, 4,0)undecene-7, amine compounds such as tributylamine and benzyldimethylamine, imidazole compound such as 2-methylimidazole, organic phosphines such as triphenylphosphine and methyldiphenylphosphine, tetra-substituted phosphonium.tetra-substituted borate such as tetraphenylphosphonium.tetraphenylborate, tetraphenylphosphonium.tetrabenzoic acid borate, tetraphenylphosphonium.tetranaphthoic acid borate, tetraphenylphosphonium.tetranaphthoyloxyborate, tetraphenylphosphonium.tetranaphthyloxyborate, and the like. These curing accelerators may be used either individually or in combination of two or more.

The glycerol tri-fatty acid ester produced by a dehydration condensation reaction of glycerol and a saturated fatty acid with a carbon atom content of 24-36 has a function of providing the epoxy resin composition with sufficient flowability and improved mold releasability. Glycerol trilignoceric acid ester, glycerol tricerotic acid ester, glycerol trimontanic acid ester and the like can be given as specific examples. These glycerol tri-fatty acid esters may be used either individually or in combination of two or more.

A saturated fatty acid with a carbon atom content of 23 or less is not desirable for use in esterification, since the resulting ester has only insufficient mold releasability. If the carbon atom content is 37 or more, on the other hand, the molecular weight is too large for the resulting ester to exhibit adequate flowability. In addition, excessive ooze-out of the releasing agent may cause the mold to become soiled and the resin to become delaminated from the lead frame. Monoesters and diesters of glycerol fatty acid are not desirable, because the remaining hydroxyl groups may impair the moisture resistance of the cured products made from the epoxy resin composition, adversely affecting solder crack resistance. The carbon atom content of the saturated fatty acid in the present invention refers to the total number of carbon atoms of the alkyl group and the carboxyl group in the saturated fatty acid.

The amount of glycerol trifatty acid esters to be added is preferably 0.02-1 wt % of the total amount of the epoxy resin composition.

The hydrotalcite compounds used in the present invention are preferably compounds shown by the following formula (1) and/or a sintered material of these compounds. The hydrotalcite compounds have a layered structure and contain aluminum and magnesium as main components.

$$Mg_xAl_y(OH)_zCO_3 \cdot nH_2O \qquad (1)$$

In the formula, x, y, z, and n are positive numbers.

Hydrotalcite compounds are commonly used as an ion trap agent for capturing ionic impurities in plastics. In addition to the function as the ion trap agent, it is a feature of the present invention that the hydrotalcite compounds have a function as a dispersion adjuvant for causing the above-mentioned mold releasing agent to homogeneously ooze out. In general, in the reaction of an epoxy resin and a phenol resin, not only the reaction between a glycidyl group and a hydroxyl group, but also the reaction of a glycidyl group and a glycidyl group occurs. The rate of these reactions is greatly affected by the pH of the entire reaction system. In many cases, the epoxy resin composition used as a encapsulating material for semiconductor devices is acidic as a whole due to the acidic nature of phenol and effects of various small quantity additives. In an acidic atmosphere, since dissociation of hydrogen from phenolic hydroxyl groups is restricted, the reaction between glycidyl groups in the epoxy resin and hydroxyl groups in the phenol resin is retarded. For this reason, the reaction rate between glycidyl groups and glycidyl groups increases as the acidity increases. When this reaction is promoted, the resin skeleton structure of the cured resin product becomes uneven as compared with the case where only an optimal reaction between glycidyl groups and hydroxyl groups proceeds. Uneven stains are produced on the surfaces of the mold and packages in this manner. The pH of the whole system can be reverted to a neutral side by the addition of the hydrotalcite compound of the present invention, whereby it is possible to inhibit the above-mentioned unevenness of the resin skeleton structure. As a result, uniform ooze-out of the releasing agent can be ensured and local stains on the mold surface and package can be prevented. As examples of the hydrotalcite compound, hydrotalcite and its sintering product can be given. Hydrotalcite is a natural mineral with a chemical formula of $Mg_6Al_2(OH)_{16}CO_3 \cdot nH_2O$ in a narrow sense. There are some differences in the proportion of elements contained depending on raw material ores. Hydrotalcite can also be easily synthesized at room temperature under normal pressure. As the hydrotalcite compound, hydrotalcite of the above formula (1) in which $0.15 \leq (y/x+y) \leq 0.35$, $1.8 \leq (z/x+y) \leq 2.5$, and $0 \leq n \leq 5$ and/or its sintering product are preferable. Specific preferable examples of the hydrotalcite compound include $Mg_{4.5}Al_2(OH)_{13}CO_3 \cdot 3.5H_2O$, $Mg_{4.5}Al_2(OH)_{13}CO_3$, $Mg_5Al_{1.5}(OH)_{13}CO_3 \cdot 3.5H_2O$, $Mg_5Al_{1.5}(OH)_{13}CO_3$, $Mg_6Al_2(OH)_{16}CO_3 \cdot 4H_2O$, $Mg_6Al_2(OH)_{18}CO_3$, and $Mg_{4.3}Al(OH)_{12.6}CO_3 \cdot nH_2O$. The sintering product of the hydrotalcite can be obtained by sintering the above-mentioned hydrotalcite, for example, at 400-900° C. As specific preferable examples of the sintered hydrotalcite, $Mg_{0.65}Al_{0.35}O_{1.175}$, $Mg_{0.7}Al_{0.3}O1.15$, $Mg_{0.75}Al_{0.25}O_{1.125}$, $Mg_{0.8}Al_{0.2}O_{1.1}$, and the like can be given. Although some hydrotalcite compounds contain a slight amount of impurities, such hydrotalcite compounds are expected to exhibit the effect of the present invention if their properties are reverted to a neutral side.

If the amount of the hydrotalcite compound incorporated is too small, ions cannot be sufficiently captured and the effect of reducing stains of the mold and package surface is inadequate. If the amount is too large, the flowability of the resin will decrease. The amount in the total resin composition is 0.01-5 wt %, preferably 0.01-3 wt %, and particularly preferably 0.01-1 wt %. The method of adding the hydrotalcite compound to the resin composition is not specifically restricted. Usually, a method of directly adding and mixing with the other components is preferable for promoting high temperature and high humidity reliability at low cost.

The average particle diameter of the hydrotalcite compound is usually 0.01-5 µm, preferably 0.01-3 µm, and particularly preferably 0.01-1 µm. If the average particle diameter is less than 0.01 µm, flowability of the resin composition may be impaired; if more than 5 µm, the ion trapping rate may decrease. The maximum particle diameter of the hydrotalcite compound is preferably 50 µm or less.

The specific surface area of the hydrotalcite compound is usually 50 $m^2$/g or less, preferably 30 $m^2$/g or less, and particularly preferably 20 $m^2$/g or less. A specific surface area of the hydrotalcite compound exceeding 50 $m^2$/g may impair flowability of the resin composition.

As specific commercially available hydrotalcite products with the above formula (1) of the present invention, a product obtained by pulverizing a naturally occurring compound containing $Mg_6Al_2(OH)_{16}CO_3 \cdot 4H_2O$ as a main component and adjusting the particle size and DHT-4A shown by the formula $M_{4.3}Al(OH)_{12.6}CO_3 \cdot nH_2O$ (manufactured by Kyowa Chemical Industry Co., Ltd.) are particularly preferable. As specific commercially available sintered hydrotalcite, IXE-700F manufactured by Toagosei Co., Ltd. is particularly preferable.

Various additives are appropriately added to the epoxy resin composition of the present invention containing the components (A)-(F) as essential components. Such additives include silane coupling agents such as epoxy silane, mercapto silane, amino silane, alkyl silane, ureido silane, and vinyl silane; coupling agents such as a titanate coupling agent, an aluminum coupling agent, and an aluminum/zirconium coupling agent; coloring agents such as carbon black and red iron oxide; natural waxes such as camauba wax; synthetic waxes such as polyethylene wax; releasing agents such as a higher fatty acid or a metal salt thereof such as stearic acid and zinc stearate and paraffin; stress reducing components such as silicone oil and silicone rubber; flame retardants such as brominated epoxy resin, antimony trioxide, aluminum hydroxide, magnesium hydroxide, zinc borate, zinc molybdate, and phosphazene; inorganic ion exchangers such as bismuth oxide hydrate; and the like.

The epoxy resin composition of the present invention can be produced by homogeneously mixing the above-mentioned components (A)-(F) and other additives using a mixer or the like at an ordinary temperature, melting and kneading the mixture using a heating roller, a kneader, or an extruder, cooling the kneaded material, and pulverizing the resulting product.

To manufacture semiconductor devices by encapsulating semiconductor elements using the epoxy resin composition of the present invention, the resin composition may be formed and cured by a molding method such as transfer mold, compression mold, and injection mold.

EXAMPLES

The present invention will be explained in more detail by examples which are not intended to be limiting of the present invention. The amounts in the examples are indicated by parts by weight.

Example 1

The following components were mixed at an ordinary temperature using a mixer. The mixture was melted and kneaded using a heating roller at 80-100° C. and the kneaded product was cooled and pulverized to obtain an epoxy resin composition.

| | |
|---|---|
| Biphenyl epoxy resin (YX4000HK manufactured by Japan Epoxy Resins Co., Ltd., melting point: 105° C., epoxy equivalent: 191) | 6.3 parts by weight |
| Phenol aralkyl resin (XLC-LL manufactured by Mitsui Chemicals, Inc., softening point: 79° C., hydroxyl equivalent: 174) | 5.8 parts by weight |
| Triphenyl phosphine | 0.2 part by weight |
| Spherical silica (average particle diameter: 20 µm) | 87.0 parts by weight |
| Glycerol trimontanic acid ester | 0.2 part by weight |
| Hydrotalcite {$Mg_6Al_2(OH)_{16}CO_3 \cdot 4H_2O$, made from a naturally occurring compound by pulverization and particle size adjustment} | 0.1 part by weight |
| Bismuth oxide hydrate | 0.1 part by weight |
| Carbon black | 0.3 part by weight |

The evaluation results are shown in Table 1.

Evaluation Items

Continuous molding: 160 pLQFP (24 mm×24 mm×1.4 mm (thickness)) was continuously formed using a transfer molding machine under the conditions of a mold temperature of 175° C., transfer pressure of 9.3 MPa, and curing time of 60 seconds. The number of shots until a mold failure such as gate clogging, air vent clogging, package adhesion to the mold, or cull omission occurs was indicated as a release failure. The number of shots until defects such as oil floating or a blur occur on the surface of the package was indicated as package appearance failure.

Solder resistance: 80 pQFP (14 mm×20 mm×2.7 mm (thickness)) was formed using a transfer molding machine under the conditions of a mold temperature of 175° C., injection pressure of 9.3 MPa, and curing time of 60 seconds, post-cured for four hours at 175° C., allowed to stand for 168 hours in a thermo-hygrostat at 85° C. and 85% RH, and subjected to an IR reflow process (260° C., three times) to evaluate the solder resistance. Samples with no cracks or delaminating were regarded to be acceptable (n=36).

Examples 2-7 and Comparative Examples 1-4

Epoxy resin compositions were prepared in the same manner as in Example 1 from the components shown in Table 1 and evaluated in the same manner as in Example 1.

The evaluation results are shown in Table 1.

The components other than those used in Example 1 are as follows.

o-Cresol novolac epoxy resin (softening point: 55° C., epoxy equivalent: 196)

Phenol novolac resin (softening point: 81° C.: hydroxyl equivalent: 105)

Glycerol tricerotic acid ester (carbon atom content: 26)

Glycerol tristearic acid ester (carbon atom content: 18)

Glycerol tri-long-chain fatty acid ester (carbon atom content: 37)

Glycerol monomontanic acid ester (carbon atom content: 29)

TABLE 1

|  |  |  | Example | | | | | | | Comparative example | | | |
|---|---|---|---|---|---|---|---|---|---|---|---|---|---|
|  |  |  | 1 | 2 | 3 | 4 | 5 | 6 | 7 | 1 | 2 | 3 | 4 |
| Component A | Biphenyl epoxy resin | | 6.3 | 6.3 | 6.3 | 6.3 | 6.3 | | 4.2 | 6.4 | 6.4 | 6.3 | 6.3 |
|  | o-Cresolnovolac epoxy resin | | | | | | | 8.5 | 4.2 | | | | |
| Component B | Phenolaralkyl resin | | 5.8 | 5.7 | 5.8 | 5.8 | 5.7 | | | 5.8 | 5.8 | 5.8 | 5.8 |
|  | Phenolnovolac resin | | | | | | | 4.5 | 4.7 | | | | |
| Component C | Triphenylphosphine | | 0.2 | 0.2 | 0.2 | 0.2 | 0.2 | 0.2 | 0.2 | 0.2 | 0.2 | 0.2 | 0.2 |
| Component D | Spherical silica (average particle diameter: 20 μm) | | 87.0 | 87.0 | 87.0 | 87.0 | 87.0 | 86.0 | 86.0 | 87.0 | 87.0 | 87.0 | 87.0 |
| Component E | Glycerol trimontanic acid ester (C29) | | 0.2 | 0.2 | | 0.1 | 0.1 | 0.2 | 0.2 | 0.2 | | | |
|  | Glycerol tricerotic acid ester (C26) | | | | 0.2 | 0.1 | 0.2 | | | | | | |
| Component F | Hydrotalcite | | 0.1 | 0.2 | 0.1 | 0.1 | 0.1 | 0.1 | 0.1 | | 0.1 | 0.1 | 0.1 |
| Ester other than component E | Glycerol tristearic acid ester (C18) | | | | | | | | | | 0.2 | | |
|  | Glycerol tri-long-chain fatty acid ester (C37) | | | | | | | | | | | 0.2 | |
|  | Glycerol monomontanic acid ester (C29) | | | | | | | | | | | | 0.2 |
| Other | Zinc stearate | | | | | | | 0.1 | | | | | |
|  | Bismuth oxide hydrate | | 0.1 | 0.1 | 0.1 | 0.1 | 0.1 | 0.1 | 0.1 | 0.1 | 0.1 | 0.1 | 0.1 |
|  | Carbon black | | 0.3 | 0.3 | 0.3 | 0.3 | 0.3 | 0.3 | 0.3 | 0.3 | 0.3 | 0.3 | 0.3 |
| Continuous formability | Release failure | No. of shots | >500 | >500 | >500 | >500 | >500 | >500 | >500 | >500 | 150 | >500 | >500 |
|  | PKG appearance failure | No. of shots | >500 | >500 | >500 | >500 | >500 | >500 | >500 | 150 | 150 | 200 | >500 |
| Solder resistance | Crack failure | n = 36 | 0 | 0 | 0 | 0 | 0 | 0 | 0 | 0 | 0 | 0 | 11 |
|  | Delamination failure | n = 36 | 0 | 0 | 0 | 0 | 0 | 0 | 0 | 0 | 0 | 6 | 12 |
| Overall evaluation | | | ○ | ○ | ○ | ○ | ○ | ○ | ○ | x | x | x | x |

In Examples 1-7 in which the epoxy resin composition of the present invention was used, stains on the surface of the package were remarkably reduced as compared with Comparative Example 1 in which no hydrotalcite compound was added. In Examples 1-7, releasability from the mold was excellent and stains on the surface of the package were remarkably reduced as compared with Comparative Example 2 in which the glycerol tri-fatty acid ester obtained by the dehydration condensation reaction of glycerol and a saturated fatty acid with a carbon atom content of 18 was used. In Examples 1-7, stains on the surface of the package and mold parting failure were remarkably reduced as compared with Comparative Example 3 in which the glycerol tri-fatty acid ester obtained by the dehydration condensation reaction of glycerol and a saturated fatty acid with a carbon atom content of 37 was used. In Examples 1-7, cracks and mold parting failure were remarkably reduced as compared with Comparative Example 4 in which the glycerol mono-fatty acid ester was used.

INDUSTRIAL APPLICABILITY

The present invention provides an epoxy resin composition for encapsulating semiconductors exhibiting excellent mold releasability and producing only a slight amount of stains on the surfaces of the mold and semiconductor packages and a semiconductor device exhibiting excellent solder resistance. The epoxy resin composition and the semiconductor device can be suitably used in the fields of electric appliances and vehicles as a material compatible with the environment and applicable to a lead-free solder.

The invention claimed is:

1. An epoxy resin composition for encapsulating semiconductors, comprising:
   an epoxy resin;
   a phenol resin;
   an inorganic filler;
   a curing accelerator;
   a glycerol tri-fatty acid ester produced by dehydration condensation reaction of glycerol and a saturated fatty acid with a carbon atom content of 24-36; and
   a hydrotalcite compound,
   wherein the inorganic filler is provided in an amount of 80-94 wt % based on an overall weight of the epoxy resin composition, the glycerol tri-fatty acid ester is provided in an amount of 0.02-1 wt % based on the overall weight of the epoxy resin composition, and the hydrotalcite compound is provided in an amount of 0.01-5 wt % based on the overall weight of the epoxy resin composition, has an average particle diameter of 0.01-5 μm and has a specific surface area of 50 $m^2/g$ or less.

2. The epoxy resin composition for encapsulating semiconductors according to claim 1, wherein the hydrotalcite compound is a compound having a formula, $Mg_xAl_y(OH)_zCO_3.nH_2O$, where x, y, z, and n are positive numbers, a sintered material of the compound having the formula, $Mg_xAl_y(OH)_zCO_3.nH_2O$, where x, y, z, and n are positive numbers, or a combination of thereof.

3. The epoxy resin composition for encapsulating semiconductors according to claim 2, wherein the hydrotalcite compound is a hydrotalcite of the formula in which $0.15 \leq (y/x+y) \leq 0.35$, $1.8 \leq (z/x+y) \leq 2.5$, and $0 \leq n \leq 5$, a sintered material of the hydrotalcite of the formula in which $0.15 \leq (y/x+y) \leq 0.35$, $1.8 \leq (z/x+y) \leq 2.5$, and $0 n \leq 5$, or a combination thereof.

4. The epoxy resin composition for encapsulating semiconductors according to claim 1, wherein the hydrotalcite compound is a compound having a formula, $Mg_6Al_2(OH)_{16}CO_3.4H_2O$.

5. A semiconductor device comprising a semiconductor element encapsulated using the epoxy resin composition according to claim 1.

6. A semiconductor device comprising a semiconductor element encapsulated using the epoxy resin composition according to claim 2.

7. A semiconductor device comprising a semiconductor element encapsulated using the epoxy resin composition according to claim 3.

8. A semiconductor device comprising a semiconductor element encapsulated using the epoxy resin composition according to claim 4.

* * * * *